(12) United States Patent
Juventin et al.

(10) Patent No.: US 9,706,671 B2
(45) Date of Patent: Jul. 11, 2017

(54) DEVICE FOR SUPPORTING A POWER STORAGE ASSEMBLY

(71) Applicant: BLUE SOLUTIONS, Ergue Gaberic (FR)

(72) Inventors: Anne-Claire Juventin, Quimper (FR); Laurent Le Gall, Ergue Gaberic (FR)

(73) Assignee: BLUE SOLUTIONS, Ergue Gaberic (FR)

( * ) Notice: Subject to any disclaimer, the term of this patent is extended or adjusted under 35 U.S.C. 154(b) by 0 days.

(21) Appl. No.: 14/397,848

(22) PCT Filed: Apr. 30, 2013

(86) PCT No.: PCT/EP2013/058967
§ 371 (c)(1),
(2) Date: Oct. 29, 2014

(87) PCT Pub. No.: WO2013/164332
PCT Pub. Date: Nov. 7, 2013

(65) Prior Publication Data
US 2015/0111079 A1   Apr. 23, 2015

(30) Foreign Application Priority Data

Apr. 30, 2012 (FR) .................................... 12 53982

(51) Int. Cl.
*H05K 5/00* (2006.01)
*H01M 2/10* (2006.01)
(Continued)

(52) U.S. Cl.
CPC ........... *H05K 5/0021* (2013.01); *H01B 19/00* (2013.01); *H01G 2/02* (2013.01); *H01M 2/1005* (2013.01);
(Continued)

(58) Field of Classification Search
CPC ...... H01M 2/10; H01M 2/1077; H01M 2/206; H01M 10/425; H01M 2/1005;
(Continued)

(56) References Cited

U.S. PATENT DOCUMENTS

| 989,738 | A | * | 4/1911 | Waterbury | ............ H01M 2/105 16/DIG. 15 |
| 5,567,542 | A | * | 10/1996 | Bae | ..................... H01M 2/1016 429/120 |

(Continued)

FOREIGN PATENT DOCUMENTS

| EP | 1 780 825 A1 | 5/2007 |
| EP | 1 843 361 A1 | 10/2007 |

(Continued)

*Primary Examiner* — Alex Usyatinsky
(74) *Attorney, Agent, or Firm* — Blakely Sokoloff Taylor & Zafman LLP

(57) ABSTRACT

The invention relates to a device for holding power storage assemblies (3), arranged side by side in a power storage module, in position, the device including: a plate (1) made of an electrically insulating material and extending along a main plane (P); recesses (2) provided in the plate, wherein each recess is to receive a respective power storage assembly such that the longitudinal axis of the storage assembly extends perpendicular to the main plane (P); and at least one holder made of an insulating material and intended for receiving an electrical connection means for electrically connecting at least one power storage assembly to an electronic board of the module.

18 Claims, 5 Drawing Sheets

Figure 1:
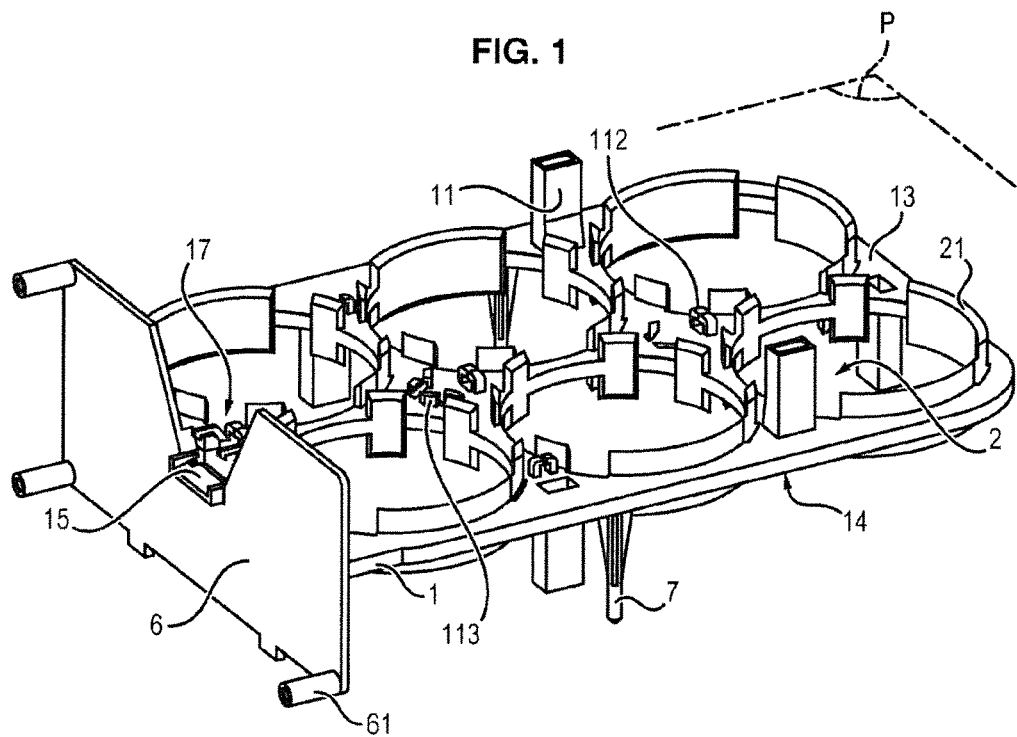

(51) Int. Cl.
*H01M 2/20* (2006.01)
*H01M 10/42* (2006.01)
*H01B 19/00* (2006.01)
*H01G 2/02* (2006.01)
*H05K 5/02* (2006.01)

(52) U.S. Cl.
CPC ......... *H01M 2/105* (2013.01); *H01M 2/1016* (2013.01); *H01M 2/1022* (2013.01); *H01M 2/1072* (2013.01); *H01M 2/1077* (2013.01); *H01M 2/206* (2013.01); *H01M 10/425* (2013.01); *H05K 5/0247* (2013.01); *Y10T 29/49227* (2015.01)

(58) Field of Classification Search
CPC .. H01M 2/105; H01M 2/1016; H01M 2/1022; H01M 2/1072; H05K 5/00; H01B 19/00; H01G 2/02; Y10T 29/49227
See application file for complete search history.

(56) References Cited

U.S. PATENT DOCUMENTS

| | | | | |
|---|---|---|---|---|
| 8,158,278 B2* | 4/2012 | Tsutsumi | ............ | H01M 2/024 |
| | | | | 429/157 |
| 2007/0253146 A1* | 11/2007 | Inoue | ............ | H01G 2/04 |
| | | | | 361/328 |
| 2011/0135993 A1* | 6/2011 | An | ............ | H01M 2/1077 |
| | | | | 429/156 |
| 2011/0305930 A1* | 12/2011 | Han | ............ | H01M 2/105 |
| | | | | 429/82 |

FOREIGN PATENT DOCUMENTS

| | | |
|---|---|---|
| EP | 2 099 085 A2 | 9/2009 |
| WO | WO 2012/013641 A1 | 2/2012 |

* cited by examiner

DEVICE FOR SUPPORTING A POWER STORAGE ASSEMBLY

TECHNICAL FIELD

The present invention relates to the general technical field of electrical power storage assemblies, particularly modules including a plurality of power storage assemblies positioned side by side and electrically connected.

Within the scope of the present invention, "electrical power storage assembly" means either a capacitor (i.e. a passive system having two electrodes and in insulator), or a supercapacitor (i.e. a system including at least two electrodes, an electrolyte and at least one separator), or a battery of the lithium battery type (i.e. a system including at least one anode, at least one cathode and an electrolyte solution between the anode and the cathode).

GENERAL PRESENTATION OF THE PRIOR ART

A power storage assembly generally includes a tubular shell closed at one of its ends at least by a lid and wherein is placed a capacitive winding and a liquid electrolyte.

Already known in the prior art are electrical power storage modules including a housing wherein are arranged several electrical energy storage assemblies 20 connected in pairs by connection links.

These modules generally include an electronic control card for managing the charging and discharging of the electrical power storage assemblies, so as to balance the electrical characteristics of the assemblies.

To accomplish this, the electronic card is connected electrically to every electrical power storage assembly using a respective electrically conducting cable.

The assembly scheme of such a module is the following. The storage assemblies are positioned side by side. The storage assemblies are electrically connected in pairs by soldering the connection links to the lids of the storage assemblies. Once all the connection links are soldered to the assemblies, the connecting cables allowing each storage assembly to be connected to the electronic card are placed.

As one module can include a large number of storage assemblies (up to a hundred), it is understood that it is very complicated to position the cables inside the module, and the assembly of a module takes a very long time.

One goal of the present invention is to propose a device and a process allowing facilitation of the assembly operation of an electrical power storage module.

PRESENTATION OF THE INVENTION

To this end, the invention proposes a device for supporting power storage assemblies arranged side by side within an energy storage module, the device including:
  a plate made of an electrically insulating material and extending along a principal plane,
  recesses made in the plate, each recess being intended to receive a respective power storage assembly such that the longitudinal axis of the storage assembly extends essentially perpendicular to the principal plane,
  at least one support made of insulating material intended to accommodate the electrical connection means for electrically connecting at least one storage assembly to an electronic card or module.

The device according to the invention not only makes it possible to facilitate the relative positioning and the isolation of elements from one another; it makes it possible to accomplish the integration of all or part of the electrical connection directly on the plate and thus prior to insertion of the elements. This enormously facilitates assembly. In addition, this allow a substantial time saving as the connecting elements can be placed on the device upstream of the principal assembly line, considering their independence with respect to the presence or absence of the assemblies in the device.

Preferred but not limiting aspects of the module according to the invention are the following:
  the device is formed in a single unit and includes a single plate. It is not necessary to provide a device comprising two plates. The costs connected with the device can thus be reduced,
  the device can be capable of receiving a plurality of distinct connection means thanks to one or several supports,
  the device is made of plastic, particularly by molding, which makes it possible to have few constraints regarding the shape of the device and of the different functional elements that it contains,
  the, or at least one of the supports includes at least one chamber extending essentially perpendicular to the plate, each chamber being intended to accommodate a respective electrical connecting plug. This connecting plug is capable in particular of cooperating with a complementary connector connected electrically to a terminal of an assembly,
  each chamber can be open at one end and includes an tie for attaching the electrical connecting plug. The tie can in particular extend toward the interior of the chamber, essentially parallel to the principal plane, the tie including an inclined face facing the opening of the chamber to facilitate the insertion of the connecting plug into the chamber and a flat face parallel to the principal plane to lock the connecting plug once it is inserted into the chamber,
  the, or at least one of the supports includes guide means made of electrically insulating material extending toward the outside of the plate for guiding, along a cable channel formed on the device, at least one connecting cable capable of electrically connecting at least one storage assembly to the electronic card. These guide means extend in particular at least partly perpendicular to the plate,
  the guide means preferably include two fingers extending perpendicular to the plate and positioned on either side of the cable passage channel. Said fingers are mutually offset or facing one another along the cable passage channel. Each finger includes in particular an excrescence extending parallel to the plate in the direction of the cable channel so as to allow clipping and holding of the cable between said fingers. When the two fingers are located facing one another, they then form an elastic clamp. When the fingers are offset, they make it possible to control the guiding of the cable when the cable channel makes a turn,
  when the chamber and the guide means for a cable are in combination in a device, they can be provided on one and the same face or on two opposite faces of the plate,
  the, or at least one of the supports can also be integrated into the plate, the electrical connection means being embedded in the assembly consisting of the support and the plate. This is particularly the case where the cable are concerned, each recess consists of a through opening, the shape of the through opening corresponding to the cross-section shape of a lateral face of the electrical power storage assembly, the dimensions of the opening being provide to allow nesting of the power storage assembly into said opening. It is thus possible to position the plate at the central portion of the storage assembly, remote from the longitudinal ends of the assembly, so as to leave free the end surfaces of the assemblies which are already in use for electrically interconnecting the assemblies and for heat-sinking the module. By configuring the device in such a way that it can be placed in the central portion of the elements, the design of the device is simplified because the latter need not take into account the electrical and thermal constraints and the contact surfaces between the connection links (generally place on the outer faces of the elements) and said elements are maximized, consequently maximizing thermal conduction while minimizing electrical resistance between the assemblies, each recess includes in particular at least one shimming wall for shimming and centering the device on the power storage assemblies, said shimming wall being positioned at the opening and extending perpendicular to the plate, particularly on either side thereof. It will be noted that the shimming wall is positioned at the edge of the recess and protrudes from the plate. The end of such a shimming wall can cooperate with one end of a peripheral skirt of a lid of the storage assembly, which makes it possible to then position the assemblies with better accuracy within the device, the device also includes at least one shank extending perpendicular to the plate on one of its faces, said shank being intended to come into contact with a wall of the power storage module to allow clamping of the device within the power storage module. The shank can also include means for attachment to the wall of the module. It can in particular include a blind threaded opening extending longitudinally for attachment by screwing the device against a wall of the module, the device also includes a base intended to accommodate the electronic card, and attachment means to hold the electronic card on said base. These means include for example a threaded stud, the electronic card being attached to the base by screwing. The base includes for example a panel extending perpendicular to the plate, at one of the ends thereof. The panel is in particular arranged relative to the plate such that it extends to either side of the plate; the device also includes coupling means located at the perimeter of the plate to fasten said device to another holding device according to one of the preceding claims.

the device also includes means for fixing a sensor on the device, such as a clip, the device also includes at least one wall essentially perpendicular to the plate and at the periphery of the plate to electrically isolate the power storage assemblies from the walls of the power storage module. It preferably includes such a wall on each of its sides. At least one, preferably each wall extends preferably over the entire dimension of the corresponding side of the plate and at a height greater than or equal to that of the assemblies. All these walls together can in particular form a casing. It will be noted that each of these walls is in particular arranged relative to the plate such that it extends to either side of the plate, the device also includes means extending essentially perpendicular to the principal plane for guiding one or more reinforcements intended to connect two opposite walls of the module. These means include in particular shanks extending between the recesses and of a height substantially equal to the height of the module, the device preferably integrates:
at least one electronic card, particularly on the base as described above, and/or
at least one electrical connecting plug at one terminal of an assembly, particularly placed in a chamber of the device as described above, and/or
at least one plug for connecting to the electronic card, and/or
at least one connecting cable for connecting the terminal of the assembly to the electronic card, particularly in the cable channel defined by the guide means as defined above,
at least one sensor, particularly attached using attachment means as defined above, The invention also relates to a power storage module including a housing wherein are arranged at least two electrical power storage assemblies and including a supporting device according to the invention.

The plate of the device preferably includes a through opening and is arranged so that the assemblies protrude from the plate on either side thereof. In other words, the plate extends over the central portion of the storage assemblies, to with the distance between the plate and each of the longitudinal ends of the assembly is greater than 20% of the distance between said two longitudinal ends. As explained above, it is very advantageous that the plate be in contact with the assembly at a distance from the ends of the assemblies, which are functional regions.

Each assembly includes a body including a side wall and open at one at least of its ends, and at least one lid closing the body at its open end. Each lid includes an end face and a skirt covering the side wall over a portion of its longitudinal dimension. The plate is positioned relative to the assemblies so as to be in contact with the side wall in its region(s) where it is not covered by the skirt of one of the lids.

The device can also include a shimming wall located at the opening and extending perpendicular to the plate, the end of the shimming wall cooperating with the end of the skirt of the, or of one of the lids of the assembly, particularly via an essentially linear stay located in a plane essentially parallel to that of the plate. It is thus possible to easily hold the plate in the central portion of the assemblies without it moving relative to the assemblies. It will be noted that the recesses and/or the shimming walls are so dimensioned that they have larger dimensions than those of the side wall of the assembly but smaller than those of the skirt of the lid.

Preferably, the assemblies, or at least two adjoining assemblies, are electrically connected by means of a connection link positioned on two end faces of the assemblies and extending essentially parallel to the plate when the assemblies are placed in the supporting device, wherein the device includes a connecting plug set inside a chamber as defined in Claims 2 and 3, said connecting plug being capable of cooperating with a tongue located protruding from the connection link, essentially perpendicular to the link.

The invention also relates to method for a method for manufacturing a module according to the invention, the method including the following steps:

Insertion of each storage assembly into a respective recess of a supporting device, preferably so that the assemblies protrude from the plate on either side thereof, Electrical connection of a connection link intended to electrically connect two adjoining storage assemblies to connection means positioned at the supporting device, to electrically connect the connection link to an electronic card of the module, Soldering the connection link to the two adjoining storage assemblies to electrically connect said adjoining storage assemblies.

Advantageously, the method also includes a step consisting of positioning the connection means on the supporting device, particularly before the insertion step, said positioning step including:

placing a connecting cable on a plate of the device using guide means extending perpendicular to the plate, placing a connecting plug in a chamber of the device, electrical connection of the connecting cable to the connecting plug.

It will be noted that it is possible to insert a portion of the assemblies, particularly half, so that the lid of these assemblies is located on a first side of the plate, then to turn over the plate and insert the other portion, particularly the other half, of the assemblies, such that their lid is situated on the other side of the plate.

PRESENTATION OF THE FIGURES

Figure 2:
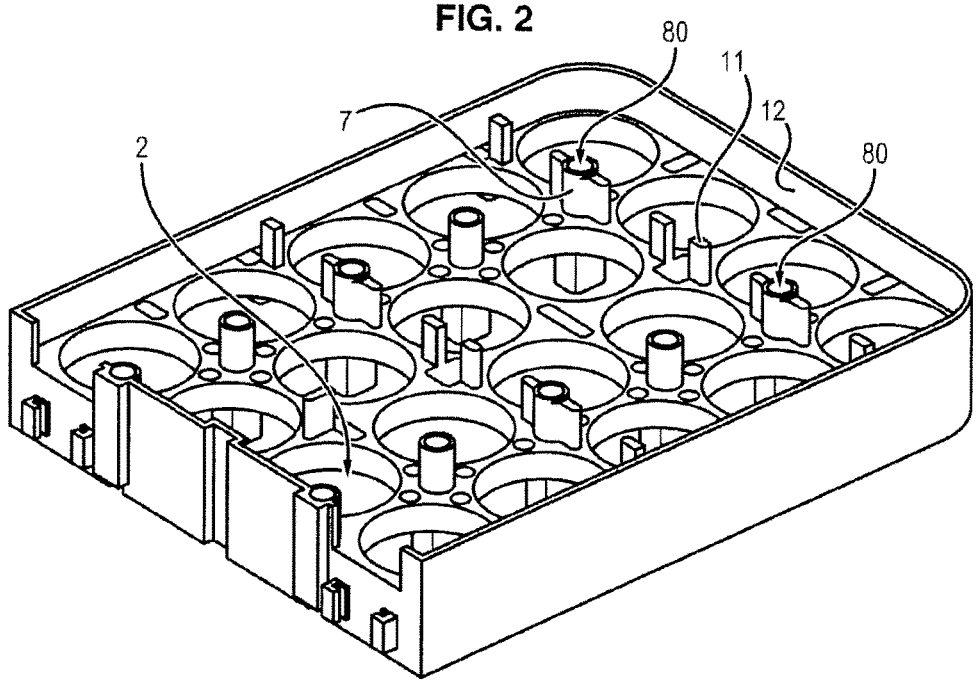
Figure 3:
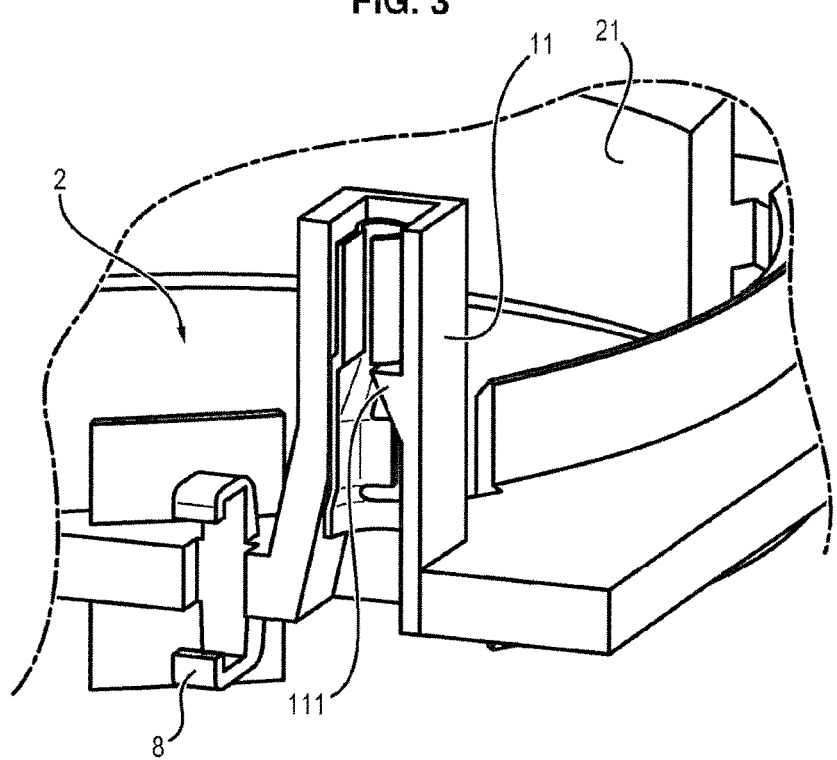
Figure 4:
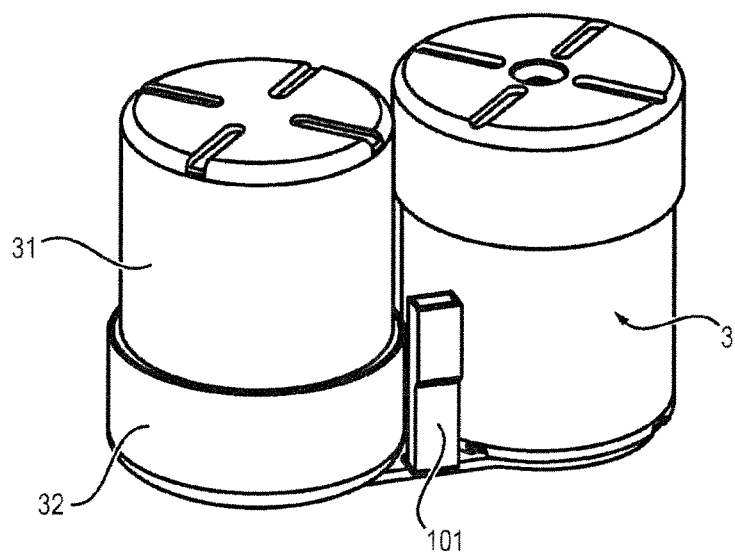
Figure 5:
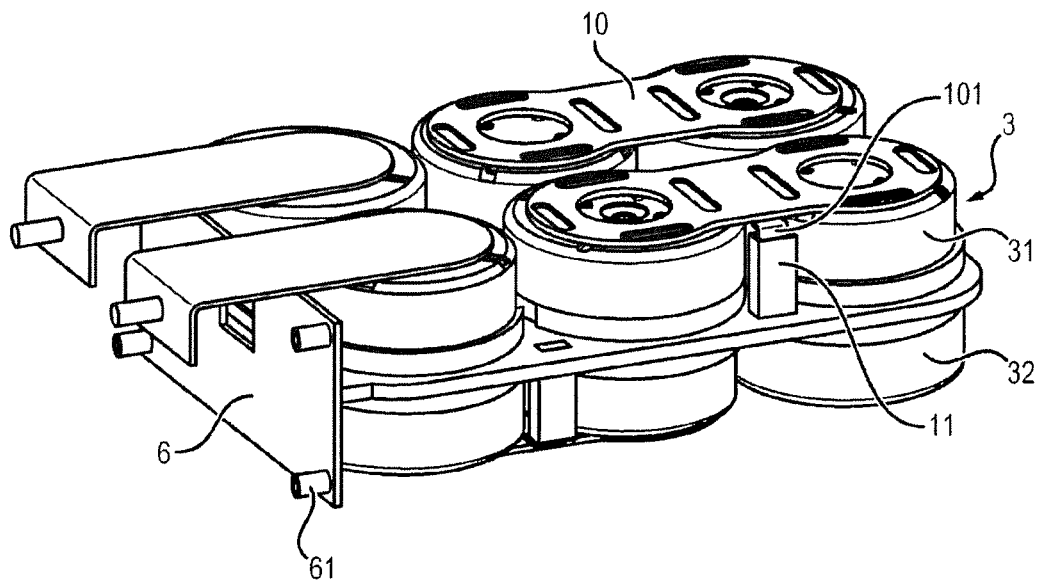
Figure 6:
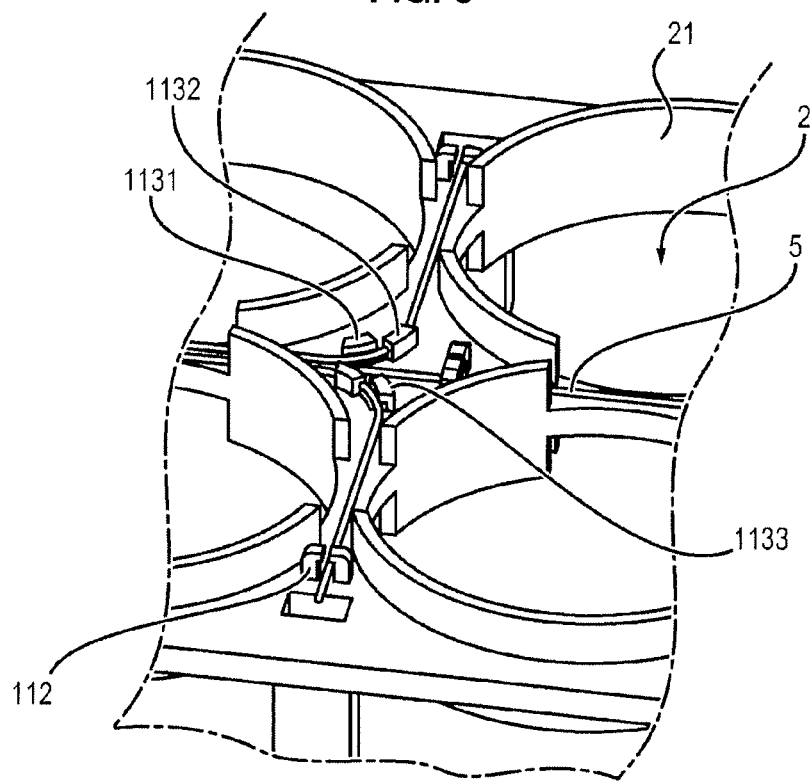
Figure 7:
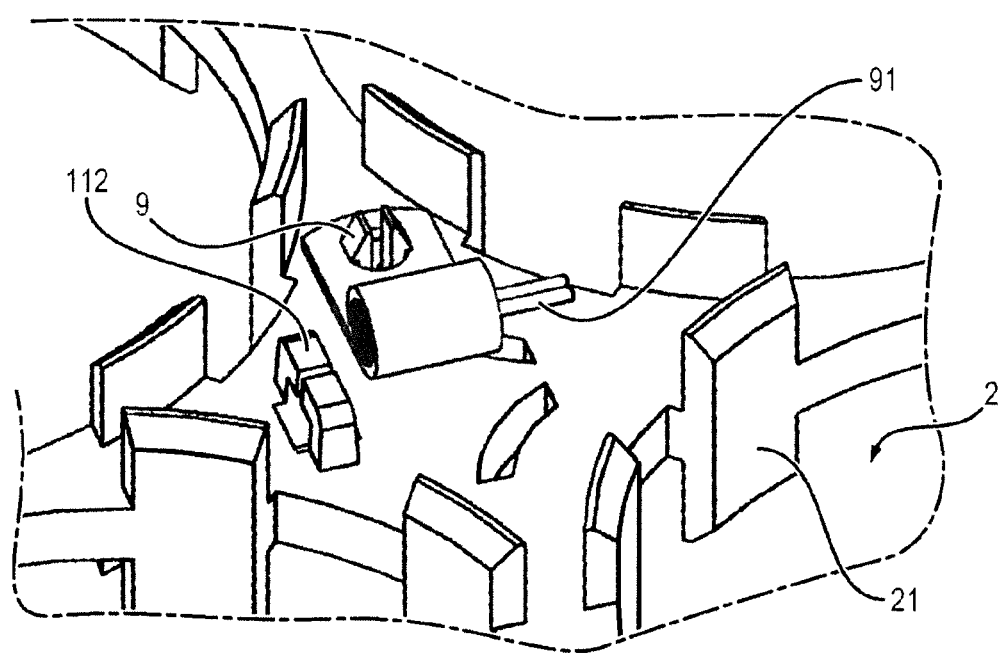
Figure 8:
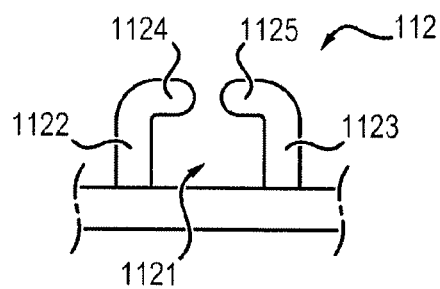
Figure 9:
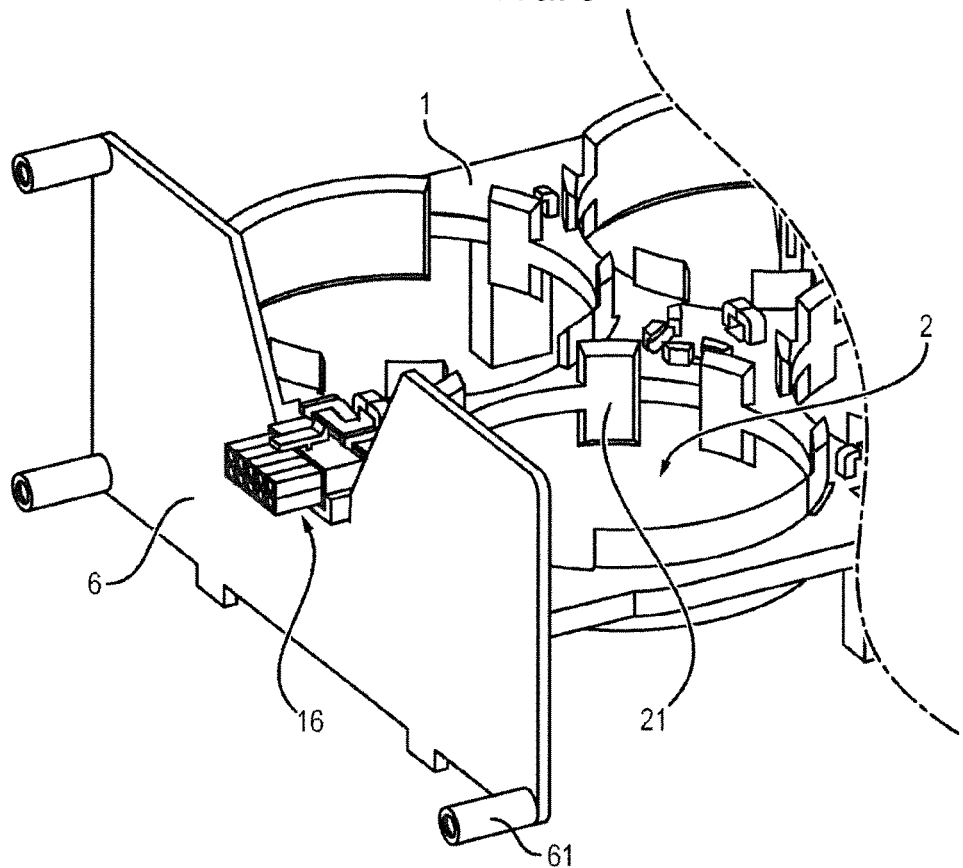
Figure 10:
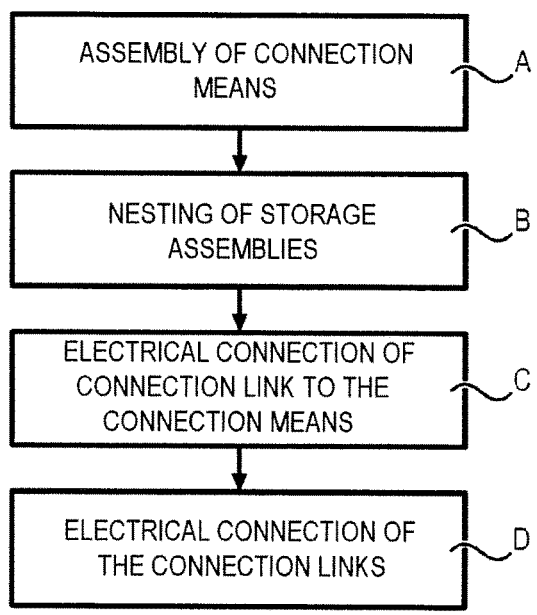

Other features, goals and advantages of the present invention will yet appear from the description that follows, which is purely illustrative and not limiting and must be read with reference to the appended drawings wherein:

FIG. 1 illustrates schematically and in perspective one embodiment of a supporting device for electrical power storage assemblies, FIG. 2 illustrates schematically and in perspective another embodiment of a supporting device for electrical power storage assemblies, FIG. 3 illustrates schematically in section and in perspective one chamber of the supporting device, FIG. 4 illustrates schematically two adjoining power storage assemblies, connected by means of a connection link, FIG. 5 illustrates schematically a plurality of power storage assemblies mounted on the supporting device, FIG. 6 illustrates schematically a detail of the supporting device, showing means for guiding a cable, FIG. 7 illustrates schematically a detail of the supporting device, showing a clip of the holding device for attaching a sensor thereon, FIG. 8 illustrates a clamp of the supporting device for guiding a cable, FIG. 9 shows a base of the supporting device, FIG. 10 illustrates the steps of a method for manufacturing a module.

DESCRIPTION OF THE INVENTION

Different embodiments of the supporting device will now be described with reference to FIGS. 1 through 9, as well as an example of the manufacturing method for a storage assembly with reference to FIG. 10. In these different figures, the equivalent elements of the supporting device bear the same numerical references.

1. Supporting Device

With reference to FIG. 1, the supporting device includes a plate 1, six recesses and a support.

The plate extends substantially within a principal plane (P). This plate is made of an electrically insulating material such as plastic.

The recesses 2 are formed in the plate 1. Each recess 2 is intended to receive one (or more) power storage assembly(ies) 3. When the storage assemblies 3 are inserted into the recesses, the longitudinal axes of the storage assemblies extend perpendicular to the principal plane P.

The support is intended to accommodate the connection means, and in particular the connecting cables allowing connection of an electronic card (not shown) of a module to the power storage assemblies.

The presence of the support makes it possible to facilitate positioning of the connection means of the assemblies to an electronic card used for managing and balancing the electrical characteristics of the storage assemblies, particularly by defining passage channels for the connecting cables extending between the electronic card and the different storage assemblies.

1.1. Support

The support is made of an insulating material such as plastic. Preferably, the support and the plate are a single unit and are obtained by molding.

The support can include—separately or in combination—one (or more) chamber(s) 11 or recesses to accommodate connecting plugs, as well as cable guide means such as holding tabs 112 and/or one (or more) guide(s) 113.

1.1.1. Means for Accommodating Connecting Plugs 1.1.1.1. Chamber (Connecting Plug at One Terminal of the Assembly)

As illustrated in FIGS. 1, 3, 4, and 5, each chamber 11 is intended to accommodate a respective electrical connecting plug 4, as for example a female connecting plug—such as an Easton socket—for insertion of a complementary male connector 101 electrically connected to an electrical power storage assembly 3. Such a complementary male connector is arranged on the connection link connecting two storage assemblies. As is more clearly visible in FIG. 4, the link connects the two assemblies by being placed on their end faces (here, the lower face), essentially parallel to the plane P. The male connector 101 consists of a blade extending perpendicular to the plane of the link.

The presence of chambers containing a connecting plug makes it possible to define connection zones of the storage assemblies prior to assembling the module and more precisely prior to insertion of the storage assemblies in the respective recesses of the supporting device.

Thus it is possible to position connecting cables 5 connecting the electronic card to each connecting plug prior to insertion of the storage assemblies into the recesses 2.

This makes it possible to reduce the time required for assembling an electrical power storage module.

In the embodiment illustrated in FIG. 1, the support includes six chambers each intended to accommodate a respective connecting plug for electrical connection of six storage assemblies to the electronic card.

Each chamber 11 extends toward the outside of the plate 1, perpendicular to the principal plane P.

Each chamber 11 consists of four walls forming a rectangular chimney wherein is inserted a respective connecting plug. Each chamber includes an end connected to the plate and a free opposite end. The chamber is open at each of its ends.

Advantageously, each chamber can include a tie 111 on one of its inner walls. This tie 111 protrudes toward the interior of the chimney, parallel to the principal plane P of the plate. It makes it possible to fasten the connection plug inside the chamber.

The tie 111 can have a leading edge that is inclined relative to the wall on which it protrudes, facing the free end of the chamber, through which the connector 101 is inserted into the chamber 11. This makes it possible to facilitate the insertion of the connector into the chamber.

Preferably, the wall of the tie opposite to the inclined wall extends perpendicular to the wall on which the tie 111 protrudes. This makes it possible to provide better locking into position of the connecting plug one it is inserted into the chamber 11.

1.1.1.2. Recess (Plug for Connecting to the Electronic Card)

As can be seen in FIGS. 1 and 9 in particular, the supporting device also includes a recess 15 for accommodating a plug 16, connecting to an electronic card, capable of cooperating with suitable pins of the electronic card.

Such a recess 15 is present on a panel 61 perpendicular to the plate 1 located at the periphery of the plate. The recess 15 includes edges to support the connector. A clearance 17 can also be provided in proximity thereto to facilitate insertion of the connecting plug. Here the clearance tightens toward the recess 15 to guide the connecting plug and to be suited for the case of an automated process.

1.1.2. Means for Guiding Cables

The guide means are intended to support one or more of the connecting cables 5 electrically connecting the electronic card to the electrical power storage assemblies 3. The two types of guide means shown in the figures will be described below.

1.1.2.1. Tabs

Each tab 112 extends over a wall of the plate, perpendicular to the principal plane P.

With reference to FIG. 1, a tab is associated with each chamber, in proximity to the linked end of the chamber 11, through which the cables pass up to the connecting plug 111. Each chamber and its associated table extend on opposite faces of the plate. The device also includes other tabs along the plate not associated with a chamber. This set of tabs makes it possible to ensure good placement of the connecting cables against the plate.

As illustrated in FIG. 1, each tab includes a slit 1121 extending over the entire height of the tab. This slit is intended to accommodate the connecting cable(s) and thus defines a passage channel for the cables. This slit defines an elastic clamp consisting of two facing branches (or fingers) 1122, 1123, the free end of each branch including a spur (or excrescence) 1124, 1125 extending toward the facing branch 1123, 1122. This makes it possible to clip and to support in position each connecting cable 5 against the plate 1.

In the embodiment illustrated in FIG. 1, chambers 11 are arranged on the two opposite faces of the plate 1. Likewise tabs 112 are provided on either side of the plate 1. This makes it possible to double the number of possible passage channels for the connecting cables 5 and thus to optimize the ergonomics of the module.

1.1.2.2. Guide

Each guide 113 makes it possible to guide one or more connecting cables 5. More precisely, each guide 113 allows a change in the direction in which the connecting cable 5 positioned within it extends.

With reference to FIG. 6, each guide 113 protrudes toward the outside of the plate perpendicular to the principal plane P. Each guide 113 consists of two fingers 1131, 1132 arranged on either side of a connecting cable passage channel. More precisely, once the connecting cable is installed in the guide 113, it extends between the fingers 1131, 1132.

In the embodiment illustrated in FIG. 6, the fingers each include a respective excrescence extending parallel to the plate in the direction of the passage channel. This makes it possible to ensure good support of the connecting cable(s) against the plate.

Preferably, the fingers 1131, 1132 are mutually offset along the passage channel. This makes it possible to facilitate changing the orientation of the connecting cable while still ensuring good placement of the connecting cable against the plate at said change in direction. The fingers can in this case be curvilinear (which means that their intersection with the plate is curvilinear).

1.2. Recess

The recess 2 can be intended to accommodate:
- two power storage assemblies 3 and a connection link 10, or
- a single storage assembly 3, as is the case in the embodiments shown.

Each recess 2 can consist of a through opening intended to accommodate a respective power storage assembly, as illustrated in FIG. 1. It will be noted that the device is so positioned that the plate is situated in the central portion of the assemblies, the assemblies protruding from the plate on either side thereof. The plate is thus located at a distance from the functional regions constituted by the end faces of the assembly in the longitudinal direction thereof.

This makes it possible to facilitate the positioning of the power storage assemblies relative to one another with a view to soldering the connection links onto them. Moreover, it facilitates the operation of assembling the module. Indeed, when the connection hardware intended to be connected to the connection plug is placed on the link, as shown in the figures, it is easier to adjust each link relative to its associated connecting plug rather than to adjust the connecting plugs relative to the links already soldered, the relative positions whereof may vary.

Preferably, the shape and the dimensions of the through opening correspond to the shape and dimensions of the cross-section of a lateral face 31 of the electrical power storage assembly 3, in a portion wherein it is not covered by the skirt 32 of the lid.

This allows nesting—possibly by force—of each power storage assembly 3 into a respective opening.

Advantageously, every recess 2 can include one (or more) wall(s) positioned at the opening and extending perpendicular to the late, on either side thereof.

This makes it possible to ensure shimming and centering of the device on the power storage assemblies. The shape of this wall—called the shimming wall—follows at least partially the contour of the lateral face 31 of the electrical power storage assembly.

Preferably, one end of this surface is intended to abut one end of a domed edge (or skirt) of a lid 32 of the assembly, surrounding the body thereof, as illustrated in FIG. 5. This makes it possible to avoid sliding of the electrical power storage assemblies relative to the supporting device, regardless of the orientation of the module, said module not necessarily being oriented so that the longitudinal axes of the storage assemblies are vertical.

1.3. Other Elements of the Device

1.3.1. Shank

As a variant or in addition to the shimming wall, the device can include one (or more) shank(s) 7 extending perpendicular to the plat on one of its faces (or on both of its faces).

The length of the shank is intended to be sufficient so that the free end of the shank comes into contact with a bottom of the power storage module so as to ensure shimming of the device within the power storage module.

Each shank 7 can include a blind threaded opening extending along the longitudinal axis of the shank 7. This threaded opening is intended to accommodate a fastening means for attaching the device to a wall of the module.

1.3.2. Base

The device can also include a base intended to accommodate one (or more) electronic card(s). This base 6 is for example positioned at the edge of the plate 1.

In the embodiment illustrated in FIG. 1, the base consists:
- of a panel 6 extending perpendicular to the plate at one end thereof,
- attachment means consisting of four studs 61 each including a hole for insertion of a means for attaching the electronic card to the studs.

In the embodiments shown, it will be noted that it is in this base that is formed the recess 15 which accommodates the connection plug 16 connecting the cables to the electronic card.

1.3.3. Clip

The module can include a sensor—such as a temperature sensor—for measuring the characteristics of the module.

To allow attachment of such a sensor, the supporting device can include a clip such as an elastic clip, formed protruding from the plate and allowing the sensor to be fastened by clipping.

1.3.4. Casing

The supporting device can also include means for isolating the power storage modules relative to at least one wall of the housing.

Preferably, these isolation means consist of at least one wall of the part running along the wall of the housing and having preferably the same dimensions as the latter.

This makes it possible to avoid the also complex insertion between the walls of the housing and the supporting device of an insulating lining such as foam. Such a wall is preferably perpendicular to the plane wherein run the recesses.

In the embodiment illustrated in FIG. 2, the structure includes a casing 12 consisting of four walls running at the edge of the plate perpendicular to the plane P so as to surround the electrical power storage assemblies.

1.3.5. Means for Guiding the Reinforcing Means

The device can also include, as can be seen in FIG. 2, shanks 80 extending over the entire height of the module once the latter is assembled. These shanks include a through opening and make it possible to accommodate means for reinforcing the module, connecting in particular the upper wall and the lower wall of the module, to mechanically reinforce the latter. Such shanks are situated between the recesses. They make it possible to ensure proper positioning of the reinforcing means (no creep) and their isolation from the storage assemblies (such reinforcements are often made of metal, a conductor).

2. Manufacturing Method

Thus, the invention uses a supporting device including means suited for incorporating numerous functions, which makes it possible to save precious time in assembling the module. As a result, even if the part constituting the supporting device is an additional part which has a cost, it makes it possible to avoid the use of numerous other construction elements and simplifies the manufacturing process. The costs of the module are thus reduced.

An example of a manufacturing method for the module will now be described with reference to FIG. 10.

In one step of the method (Step A), the electrical connection means (i.e. connection plug, connecting cable, etc.) are assembled on the supporting device, prior to introducing the storage assemblies into the recesses.

This step consisting of position connection means on the supporting device includes the sub-steps consisting of:
- placing the connecting cables on a plate of the device by attaching the cables to the guides and to the tabs so as to press the cables against the wall of the plate,
- placing the connection plugs on the storage assemblies in the chambers,
- placing the plugs for connecting to the electronic card in the recess 15
- electrically connecting the connecting cables to the connection plugs.

Once the connecting means are prepared on the device, the method includes the following steps:
- Insertion (Step B) of each storage assembly into a respective recess of a supporting device. During this step, three of the assemblies in particular are inserted into the through openings from a first side of the plate, until the end of the skirt 32 of the lid comes into abutment against the shimming walls, then the device is turned over and the other three assemblies are inserted from the other side of the plate until the ends of the skirt of the lid of each assembly come into abutment against the corresponding shimming wall,
- Electrical connection (Step C) of the connection links intended to electrically connect two adjoining storage elements to the connection means positioned at the supporting device. Soldering (Step D) of the connection link on the two adjoining storage assemblies to electrically connect said adjoining storage assemblies.

Steps C and D are more particularly carried out on one side of the module for interconnecting the ends of the assemblies located at a first end of the module; the module is then turned over and Steps C and D are carried out to interconnect the ends of the assemblies located at the other end of the module.

The structure thus obtained is then placed in a module housing and closed.

3. Alternative

The reader will have understood that numerous modifications can be applied to the previously described device without substantially departing from the novel teachings and advantages described here.

For example, the support can be integrated into the plate, the connecting means being embedded in the assembly consisting of the support and of the plate. In this case, the support includes neither tabs nor guides but can include chambers each intended to accommodate an electrical connection plug.

The device can also be modular, that is constitute a portion of an assembly including a plurality of interconnected devices. This makes it possible to make modules having variable numbers of storage assemblies from a single type of device. In this case, the device can for example include, at the edge of the plate, a coupling means 8 allowing two supporting devices according to the invention to be fastened together.

The invention claimed is:

1. A device for supporting power storage assemblies positioned side by side in a power storage module, the device including:
   a plate made of an electrically insulating material and extending along a principal plane,
   recesses formed in the plate, each recess for accommodating a respective power storage assembly, so that the longitudinal axis of the storage assembly extends essentially perpendicular to the principal plane, each recess having a through opening,
   at least one support made of electrically insulating material for accommodating electrical connection means for electrically connecting at least one power storage assembly to an electronic card of the module,
   wherein the shape of each of the through openings corresponds to the cross-section shape of the respective electrical power storage assembly taken at the level of its lateral face in its central portion, the dimensions of the through opening being such that said through opening allows nesting by force of the respective power storage assembly into said opening,
   wherein the device includes a base for accommodation of the electronic card of the module and attachment means for attaching the electronic card to said base, this base comprising a panel extending perpendicularly to the plate at one of the ends thereof and such that it extends to either side of the plate, the support, the plate and the base being a single unit.

2. The device according to claim 1, wherein the, or at least one of the supports includes at least one chamber extending essentially perpendicular to the plate, each chamber being suitable for accommodating a respective electrical connection plug.

3. The device according to claim 2, wherein each chamber is open at one end and includes a tie for attaching the electrical connection plug.

4. The device according to claim 1, wherein the, or at least one of the supports includes guide means made of electrically insulating material extending toward the outside of the plate for guiding along a passage channel a cable provided on the device, a least one connecting cable capable of electrically connecting at least one storage assembly to the electronic card.

5. The device according to claim 4, wherein the guide means include two fingers extending perpendicular to the plate and positioned on either side of the cable passage channel.

6. The device according to claim 5, wherein each finger includes an excrescence extending parallel to the plate in the direction of the cable passage channel so as to allow clipping and support of the cable between said fingers.

7. The device according to claim 1, wherein the, or at least one of the supports is integrated with the plate, the electrical connection means being embedded in the assembly consisting of the support and of the plate.

8. The device according to claim 1, wherein each recess also includes at least one shimming wall for shimming and centering the device on the power storage assemblies, said shimming wall being positioned at the opening and extending perpendicular to the plate.

9. The device according to claim 8, said device also includes at least one shank extending perpendicular to the plate over one of its faces, said shank being suitable for coming into contact with a wall of the power storage module to allow shimming of the device within the power storage module.

10. The device according to claim 1, said device also includes coupling means located at the edge of the plate for fastening said device to another supporting device according to one of the preceding claims.

11. The device according to claim 1, said device also includes means for attaching a sensor on the device.

12. The device according to claim 1, said device also includes at least one wall essentially perpendicular to the plate and at the edge of the plate to electrically isolate the power storage assemblies from the walls of the power storage module.

13. The device according to claim 1, including means extending essentially perpendicular to the principal plane for guiding reinforcements intended to link two opposite walls of the module.

14. The device according to claim 1, characterized in that it integrates:
   at least one electronic card, and/or
   at least one electrical connection plug at a terminal of an assembly, and/or
   at least one connection plug to the electronic card, and/or
   at least one connecting cable for connecting the terminal of the assembly to the electronic card, and/or
   at least one sensor.

15. A power storage module including a housing wherein are arranged at least two electrical power storage assemblies, wherein the module includes a supporting device for supporting power storage assemblies positioned side by side in a power storage module, the device including:
   a plate made of an electrically insulating material and extending along a principal plane,
   recesses formed in the plate, each recess for accommodating a respective power storage assembly, so that the longitudinal axis of the storage assembly extends essentially perpendicular to the principal plane, each recess including a through opening,
   at least one support made of electrically insulating material for accommodating electrical connection means for electrically connecting at least one power storage assembly to an electronic card of the module,
   each assembly being positioned in a respective opening and protruding from the plate of the device on either side thereof,
   wherein a shape of each of the through openings corresponds to the cross-section shape of the respective electrical power storage assembly taken at the level of its lateral face in its central portion, the dimensions of the through opening being such that said through opening allows nesting by force of the respective power storage assembly into said opening, the respective power storage assembly extending to either side of the opening, wherein the supporting device includes a base for accommodation of the electronic card of the module and attachment means for attaching the electronic card to said base, this base comprising a panel extending perpendicularly to the plate at one of the ends thereof and such that it extends to either side of the plate, the support, the plate and the base being a single unit.

16. The module according to claim 15, wherein the, or at least two adjoining assemblies are electrically connected by means of a connection link positioned on two end faces of the assemblies and extending essentially parallel to the plate when the assemblies are placed in the supporting device, wherein the device includes a connection plug positioned in the chamber, said connection plug being able to cooperate with a tongue situated protruding from the connection link, essentially perpendicular to the link.

17. A method for manufacturing a module including a housing wherein are arranged at least two electrical power storage assemblies, wherein the module includes a supporting device for supporting power storage assemblies positioned side by side in a power storage module, the supporting device including:
- a plate made of an electrically insulating material and extending along a principal plane,
- recesses formed in the plate, each recess being suitable for accommodating a respective power storage assembly, so that the longitudinal axis of the storage assembly extends essentially perpendicular to the principal plane, each recess having a through opening, wherein the shape of each of the through openings corresponds to the cross-section shape of the respective electrical power storage assembly taken at the level of its lateral face in its central portion, the dimensions of the through opening being such that said through opening allows nesting by force of the respective power storage assembly into said opening,
- at least one support made of electrically insulating material for accommodating electrical connection means for electrically connecting at least one power storage assembly to an electronic card of the module,
- a base for accommodation of the electronic card of the module and attachment means for attaching the electronic card to said base, this base comprising a panel extending perpendicularly to the plate at one of the ends thereof and such that it extends to either side of the plate, the support, the plate and the base being a single unit, the method including the following steps:
- inserting by force each storage assembly into a respective through opening of a supporting device such that, each assembly protrudes from the plate of the device on either side thereof,
- electrically connecting a connection link to electrically connect two adjoining storage assemblies to connection means positioned at the supporting device, to electrically connect the connection link to an electronic card of the module
- soldering the connection link to two adjoining storage assemblies to electrically connect said adjoining storage assemblies,
- attaching the electronic card to the base.

18. The manufacturing method according claim 17, said method also including positioning the connection means on the supporting device, said positioning step including:
- placing a connecting cable on a plate of the device using guide means extending perpendicular to the plate,
- placing a connection plug in a chamber of the device,
- electrical connection of the connecting cable to the connection plug.

* * * * *